United States Patent
Goldie

(10) Patent No.: US 7,019,372 B2
(45) Date of Patent: Mar. 28, 2006

(54) PARTICLE DETECTOR ASSEMBLY

(75) Inventor: David John Goldie, Oxon (GB)

(73) Assignee: Oxford Instruments Superconductivity LTD, Oxon (GB)

( * ) Notice: Subject to any disclaimer, the term of this patent is extended or adjusted under 35 U.S.C. 154(b) by 0 days.

(21) Appl. No.: 10/378,668

(22) Filed: Mar. 5, 2003

(65) Prior Publication Data

US 2003/0173562 A1    Sep. 18, 2003

(30) Foreign Application Priority Data

Mar. 5, 2002    (GB) .................................... 0205113

(51) Int. Cl.
*H01L 31/115*    (2006.01)
(52) U.S. Cl. ........................................ 257/429; 257/31
(58) Field of Classification Search ................. 257/30, 257/31, 428, 429
See application file for complete search history.

(56) References Cited

U.S. PATENT DOCUMENTS 5,994,694 A * 11/1999 Frank et al. ................. 250/281
6,239,431 B1 * 5/2001 Hilton et al. ............ 250/336.2
6,365,912 B1 * 4/2002 Booth et al. .................. 257/39
2003/0178567 A1 * 9/2003 Goldie ..................... 250/336.2

OTHER PUBLICATIONS

Booth, Norman E., et al., "Superconducting particle detector", 1996, Supercond. Sci. Technol. 9, pp. 493-516.*
H. Kraus et al., "Quasiparticle Trapping in a Superconductive Detector System Exhibiting High Energy and Position Resolution", vol. 231, No. 1,2, Physics Letters B, Nov. 2, 1989, pp. 195-202.
Norman E. Booth et al., Topical Review, "Superconducting particle detectors", Supercond. Sci. Technology 9 (1996) pp. 493-516.
S. Friedrich et al., "Fiske modes in superconducting tunnel junction detectors", Nuclear Instruments and Methods in Physics Research A 444 (2002), pp. 151-155.

* cited by examiner

*Primary Examiner*—Howard Weiss

(57) ABSTRACT

A particle detector assembly includes a superconducting absorber to which is coupled superconducting tunnel junction detectors for detecting particles incident on the absorber. Each superconducting tunnel junction detector includes superconducting tunnel junction devices connected in parallel.

10 Claims, 4 Drawing Sheets

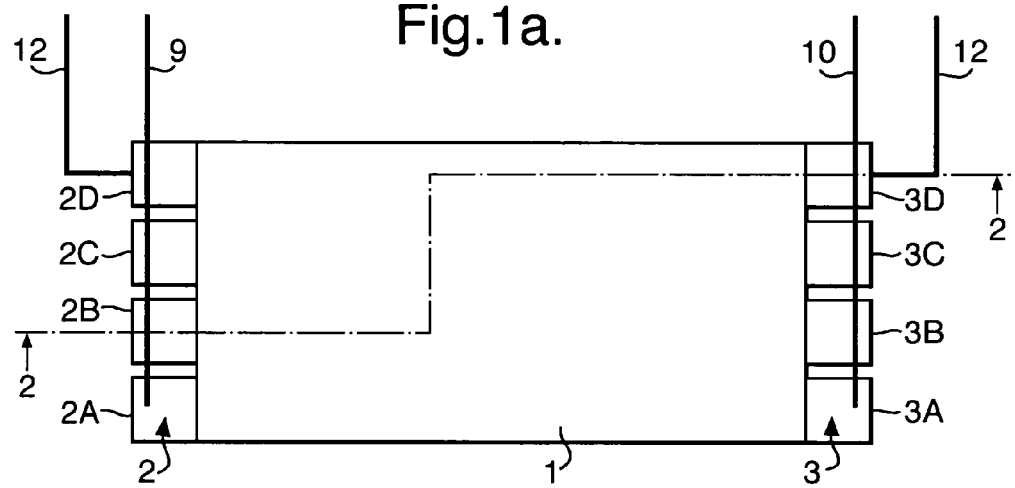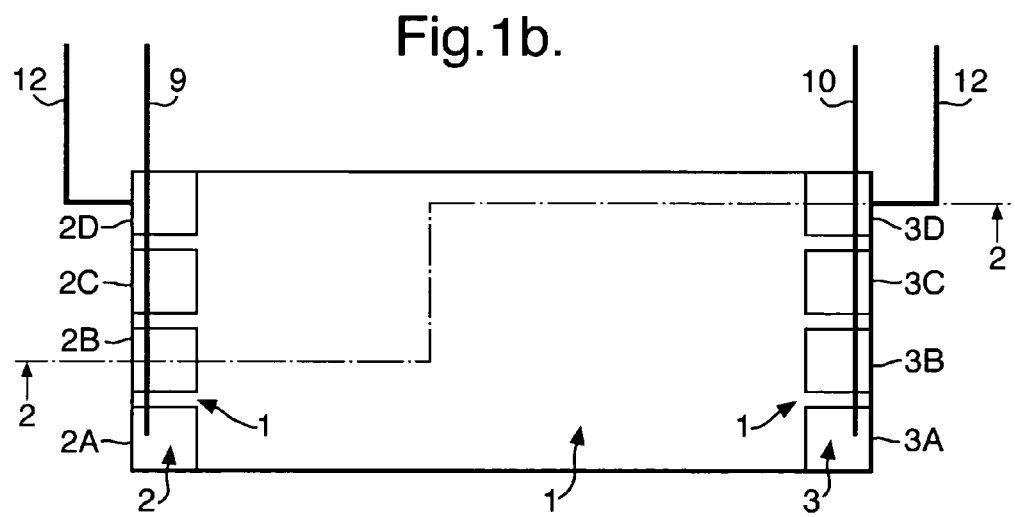

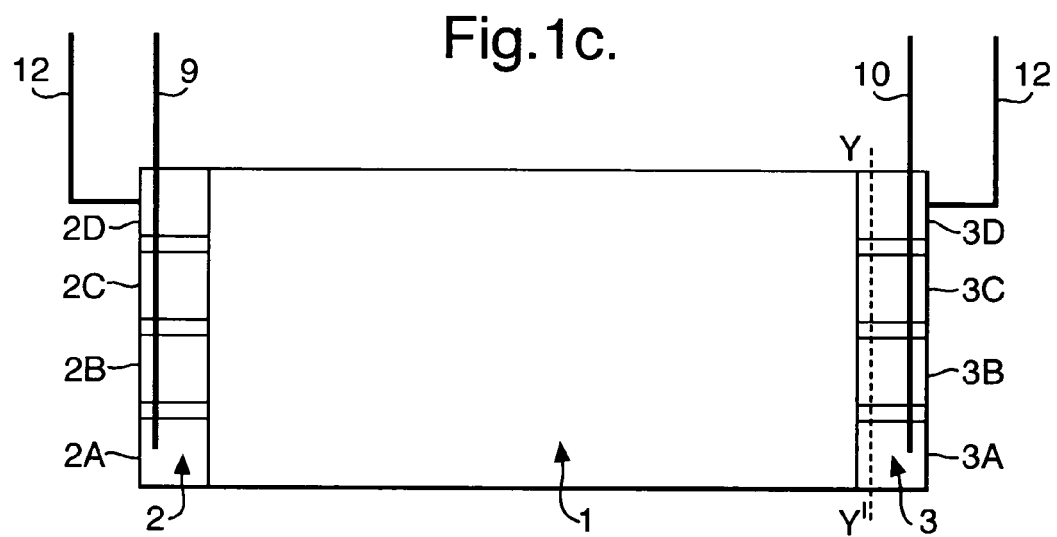

PARTICLE DETECTOR ASSEMBLY

FIELD OF THE INVENTION

The invention relates to particle detector assemblies incorporating superconducting tunnel junction (STJ) detectors.

BACKGROUND TO THE INVENTION

STJs are used for detecting particles such as photons, ions, molecules, biological fragments or other energetic particles, and have a fast response and high detection efficiency. Examples of known STJ detectors are described in "Quasiparticle trapping in a superconductive detector system exhibiting high energy and position resolution", Kraus et al, Physics Letters B, Vol. 231, No. 1,2, November 1989, pages 195–202; and "Superconducting particle detectors" Booth and Goldie, Supercond. Sci. Technol. 9 (1996) 493–516.

In order to understand the problems addressed by the present invention, the principles of operation of a STJ will now be described.

This discussion applies to the measurement of mono-energetic quanta that interact in a superconductor and are read out using a superconducting tunnel junction (STJ).

To detect incident energy from photons or other particles, a small magnetic field is applied in the plane of the tunnel barrier to suppress the zero voltage supercurrent. The STJ is electrically biassed (voltage bias is preferred) at a voltage less than the sum of the superconducting energy gaps of the films comprising the STJ. For a symmetric STJ, this means $$eV_b < 2\Delta$$

where e is the electronic charge, $V_b$ is the bias voltage and $\Delta$ is the superconducting energy gap.

When energy is deposited in one of the superconductors, Cooper pairs are broken leading to an increase in the number of quasiparticle excitations. These excitations are detected as a temporary increase in the tunneling current. The magnitude of the tunneling current that produces the detected signal is determined by the excess number of excitations, proportional to the deposited energy, and the quasiparticle tunneling rate. It follows from the details of the solution of the tunneling Hamiltonian including the initial and final densities of states and the distribution of quasiparticles as a function of energy, that the optimal bias point for maximum tunneling rate (and hence maximum signal) occurs at about $$eV_b \approx \frac{\Delta}{6}.$$

For real STJs, interaction of the ac Josephson super-current occurs with standing electromagnetic waves that are sustained in the cavity formed by the tunneling barrier. This interaction produces sharply peaked, zero frequency, currents in the STJ I–V that are known as Fiske resonances. For a two dimensional cavity of side length L, width W, the current peaks occur at voltages given by $$V_{Fiske} = \frac{h}{2e} \frac{\bar{c}}{2L} \sqrt{n^2 + m^2\left(\frac{L}{w}\right)^2}$$

Here, $\bar{c} \approx 0.03c$ is the electromagnetic wave velocity in the barrier, and h is Planck's constant. The resonant peaks lead to regions of negative resistance in the STJ I–V that can produce bias instability. The odd order resonances (m+n odd) are particularly troublesome since they are out of phase with the periodic modulation of the zero voltage supercurrent by the applied field. The STJ is unconditionally stable if the device is operated in a magnetic field to fully suppress the zero voltage supercurrent and at a bias less than the first [1,0] resonance.

This means that the maximum device size consistent with stable operation and maximum signal is given by $$L < \frac{6\hbar \bar{c}}{4\Delta}.$$

For a Ta-based STJ with $\Delta=600$ μeV, we find L<90 μm.

Technologically useful devices need to have maximum area. A solution to this has been previously suggested for a simple STJ where the detector is sub-divided into smaller sub-units ("Fiske modes in superconducting tunnel junction detectors", Friedrich et al, Nuclear Instruments and Methods in Physics Research A 444 (2000)151–155). These are simultaneously biased in parallel, and the first resonance occurs at a voltage characteristic of the sub-unit size. This solution was recognized to be possible only at the expense of overall detector energy resolution. There are inevitable small differences in the responsivity of each of the pixels leading to a broadening of the device response function to mono-energetic inputs, and a reduction in energy resolution.

SUMMARY OF THE INVENTION

In accordance with the present invention, a particle detector assembly comprises a superconducting absorber to which is coupled at least two superconducting tunnel junction detectors for detecting particles incident on the absorber characterized in that each superconducting tunnel junction detector comprises at least two superconducting tunnel junction devices connected in parallel.

We have found that the problem of energy resolution is very much reduced if a parallel connected array of STJs is used to read-out a separate superconducting absorber.

The use of an absorber with two simple STJs is known (Kraus et al 1989). In these known arrangements, two (or more) separate STJs read-out quasiparticles created by particle interactions in the superconducting absorber. The excitations diffuse in the absorber and are localised near the STJs by inelastic scattering into regions of reduced energy gap. Some degree of quasiparticle trapping is engineered to occur near and in the read-out STJs to maximise the signal. The trapping rate, and hence the detector signal to noise, is, to first order, dependent on the volume ratio of the trap to the absorber. Hence, the best detector performance is obtained with maximised absorber volume (for maximum quantum efficiency) and maximised trap volume. This requires maximum STJ read-out area. For high purity superconducting absorbers, the quasiparticle diffusion lengths within the absorber itself can be very long (indeed, we find, for Ta, extremely long intrinsic electronic mean-free-paths that are many times greater than the film thickness). This means that rapid diffusion of the excess quasiparticles in the absorbing film tends to produce a uniform distribution of excess quasiparticles irrespective of the initial interaction position.

Contrary to the acceptance in Friedrich et al, that the use of sub-divided STJs will inevitably result in a reduction in resolution, we have found that if each of the two (or more) read-out STJs coupled to the absorber is replaced by a sub-divided array of smaller STJs, wired in parallel, optimum bias conditions can be ensured with maximum total volume for the read-out STJs. Small variations in the response of each element of the read-out now make little or no contribution to the response uniformity. Variations in the response of each element of the read-out can be further reduced in their effect by allowing the absorber film to extend between all of the elements without breaks. Additionally, the lower trapping layer may be allowed to extend between each of the elements to improve quasiparticle coupling between the elements. The total number of pixels forming the array, hence total detector volume can be increased until the detector capacitance becomes excessive and the signal to noise is reduced. This restriction on device area is further reduced if a SQUID is used to read-out the STJs.

BRIEF DESCRIPTION OF THE DRAWINGS

Some examples of particle detector assemblies according to the present invention will now be described with reference to the accompanying drawings, in which:

FIG. 1a is a schematic plan of the assembly according to the first example;

FIG. 1b shows a second example with an extended absorber;

FIG. 1c shows a third example with an extended absorber and trapping layer;

DETAILED DESCRIPTION

FIG. 1a illustrates a first example of the assembly in plan view and this comprises a superconducting Ta absorber 1 to which is mounted two STJ detectors 2,3, each detector comprising an array of parallel connected STJ devices 2A–2D and 3A–3D respectively. Of course, any other known absorber material could be used such as Al, Ti, V, Nb, etc. Further, although each detector comprises four devices in this example, three or more, preferably many more, could be used.

Figure 2A:
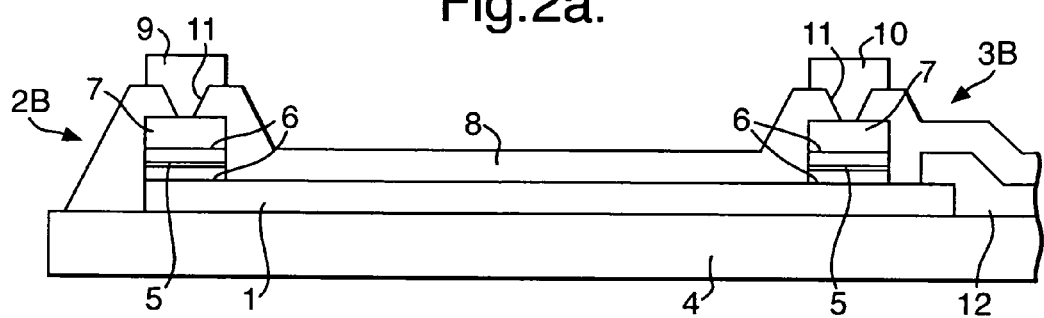
FIG. 2a is a cross-section on the line 2—2 in FIGS. 1a and 1b.

The construction of the devices shown in FIG. 1a is illustrated in more detail in FIG. 2a. As can be seen in FIG. 2a the Ta absorber (absorber film) 1, typically having an area of about 250×500 μm2 or more is provided on a sapphire substrate 4. Each STJ device 2,3 comprises an insulating barrier 5, such as AlO$_x$, sandwiched between a pair of quasiparticle traps 6, typically Al having a thickness of 30–200 nm (or another superconductor having a smaller superconducting gap than the absorbing film). A Ta top electrode 7 is located above the upper trap 6 and this structure is coated with an insulating layer 8 of, for example, SiO$_x$. Respective top electrodes 9,10 make electrical contact with the respective top electrodes 7 via holes 11 in the insulating layer 8.

As can be seen in FIG. 1a, the top electrodes 9,10 make electrical contact with each of the devices 2A–2D and 3A–3D respectively, in parallel.

A base electrode 12 of typically Niobium or any superconductor with higher energy gap than Tantalum contacts the absorber 1.

Figure 2B:
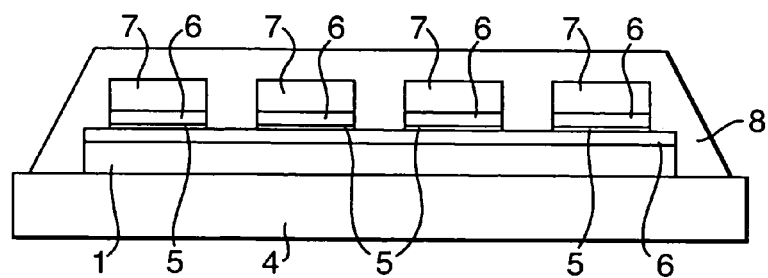
FIG. 2b is a cross-section on the line Y–Y' in FIG. 1c.

FIGS. 1b and 1c are substantially the same as FIG. 1a except for the detailed arrangement of the Ta absorber and the first trapping layer 6. In FIG. 1b the Ta absorber is continuous in the regions between the STJ devices. In this geometry however the base trapping layer is removed between the devices 2A–2D and 3A–3D. In FIG. 1c in addition to the continuous absorber, the base trapping layer is also continuous between the STJ devices 2A–2D and 3A–3D. FIG. 2b shows a cross-section of the construction along the line Y–Y' in FIG. 1c.

Figure 3:
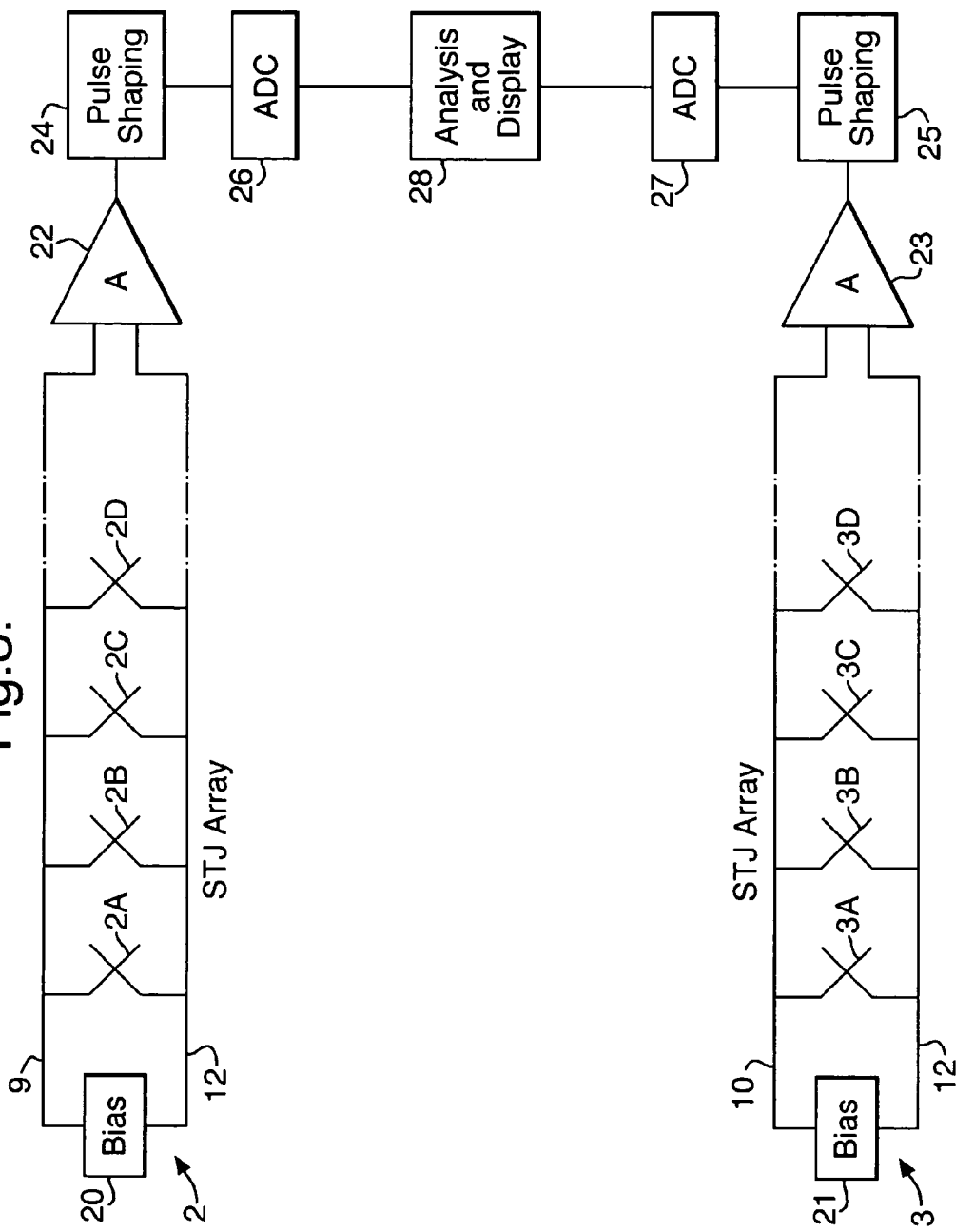
FIG. 3 is a schematic circuit diagram of the assembly.

FIG. 3 illustrates the circuit in which the STJs 2,3 are connected. Each STJ array 2,3 is connected in parallel to a bias source 20,21 which may be a voltage or current source. The arrays 2,3 are also connected to an output amplifier 22,23 which may be FET-based, charge or current sensor or a SQUID. The output of each amplifier 22,23 is fed to a respective pulse shaping circuit 24,25 and from there via a respective A/D converter 26,27 to a processor 28 connected to a display for providing a suitable output in a conventional manner.

I claim:

1. A particle detector assembly comprising: a superconducting absorber to which is coupled at least two superconducting tunnel junction detectors for detecting particles incident on the superconducting absorber, each superconducting tunnel junction detector comprising at least two superconducting tunnel junction devices connected in parallel.

2. An assembly according to claim 1, wherein each superconducting tunnel junction detector comprises at least three superconducting tunnel junction devices connected in parallel.

3. An assembly according to claim 1, wherein the superconducting absorber comprises one of Ta, Al, Ti, V or Nb.

4. An assembly according to claim 1, wherein the superconducting absorber is continuous between the parallel connected superconducting tunnel junction devices.

5. An assembly according to claim 4, further comprising a base trapping layer which is continuous between the parallel connected superconducting tunnel junction devices.

6. An assembly according to any of the preceding claims, wherein the said at least two superconducting tunnel junction detectors are disposed upon opposed sides of the superconducting absorber such that an absorbing area is defined therebetween.

7. An assembly according to claim 1, further comprising:
a bias source which biases at least one of the superconducting tunnel junctions detectors; and
an output amplifier which amplifies an output of at least one of the superconducting tunnel junction detectors.

8. An assembly according to claim 1, further comprising a plurality of base trapping layers, each of the base trapping layers disposed between one of the superconducting tunnel junction detectors and the superconducting absorber.

9. An assembly according to claim 1, wherein the superconducting absorber has an area of substantially 250×500 μm or more.

10. An assembly according to claim 1, wherein each superconducting tunnel junction device comprises an insulating barrier sandwiched between a pair of quasi-particle traps.

* * * * *